United States Patent
Brian et al.

(10) Patent No.: US 7,135,854 B2
(45) Date of Patent: *Nov. 14, 2006

(54) REAR-MOUNTED GIMBAL FOR SUPPORTING TEST HEAD

(75) Inventors: Bosy J. Brian, Framingham, MA (US);
High F. David, Belmont, MA (US);
Lewinnek W. David, Cambridge, MA (US); Vayner Vladimir, Needham, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/006,490

(22) Filed: Dec. 7, 2004

(65) Prior Publication Data

US 2005/0127897 A1  Jun. 16, 2005

Related U.S. Application Data

(62) Division of application No. 10/184,488, filed on Jun. 28, 2002, now Pat. No. 6,828,774.

(60) Provisional application No. 60/359,863, filed on Feb. 27, 2002.

(51) Int. Cl.
*G01R 31/28* (2006.01)

(52) U.S. Cl. .................................................. 324/158.1

(58) Field of Classification Search ............ 324/158.1, 324/754, 755, 758, 765; 414/590, 673, 744.1, 414/744.2
See application file for complete search history.

(56) References Cited

U.S. PATENT DOCUMENTS

| 4,973,015 | A | | 11/1990 | Beaucoup et al. ........... 248/124 |
|---|---|---|---|---|
| 5,606,262 | A | | 2/1997 | Montalbano et al. ....... 324/758 |
| 5,931,048 | A | * | 8/1999 | Slocum et al. ........... 74/490.07 |
| 5,949,002 | A | | 9/1999 | Alden ....................... 73/866.5 |
| 6,023,173 | A | | 2/2000 | Khater et al. ................ 324/758 |
| 6,396,257 | B1 | * | 5/2002 | Baum et al. .............. 324/158.1 |

OTHER PUBLICATIONS

U.S. Appl. No. 09/615,292, filed Jul. 13, 2000, Herrera.

* cited by examiner

*Primary Examiner*—Ha Tran Nguyen
*Assistant Examiner*—Tung X. Nguyen
(74) *Attorney, Agent, or Firm*—Daly, Crowley, Mofford, & Durkee, LLP

(57) ABSTRACT

A manipulator for supporting heavy as well as lighter test heads in a small footprint includes a body and an interface for supporting a test head from behind. The interface includes a first portion fixedly attached to the body and a second portion fixedly attached to the rear of the test head. The first and second portions of the interface are rotatably coupled together to allow rotation of the test head about its approximate center of mass. Although the weight of the test head is entirely borne from the rear, the test head can still be moved with relatively little applied force, thereby satisfying the requirements for compliant docking.

20 Claims, 7 Drawing Sheets

REAR-MOUNTED GIMBAL FOR SUPPORTING TEST HEAD

RELATED APPLICATIONS

This application is a divisional patent application of Ser. No. 10/184,488, filed Jun. 28, 2002 and entitled "REAR-MOUNTED GIMBAL FOR SUPPORTING TEST HEAD", now U.S. Pat. No. 6,828,774, which claims priority to provisional application 60/359,863 filed on Feb. 27, 2002.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

1. Field of the Invention

This invention relates generally to precisely positioning heavy objects, and more particularly to precisely positioning a test head of an electronic automatic test system for docking the test head with a prober, handler, or other peripheral for testing electronic devices.

2. Description of Related Art

Manufacturers of semiconductor chips and assemblies use automatic test equipment ("ATE") to verify the performance of devices before the devices are shipped to customers. ATE systems typically include a "test head" and a "tester body." The test head houses portions of the test system that are preferably located as close as possible to the device under test, and connects to the tester body via one or more cables. For testing electronic devices, the test head connects or "docks" with a peripheral. The peripheral feeds a series of devices to the ATE system for testing, and the ATE system tests the devices.

Constraints affecting semiconductor test processes often make it impractical to move the peripheral to the test head. In most manufacturing facilities, therefore, the peripheral that feeds the chips remains stationary, and the test head is moved into position for docking with the peripheral.

A device called a "manipulator" is used to move the test head to the peripheral. As is known, a common type of manipulator is the fork-arm manipulator, an example of which is shown in FIG. 1. Here, a manipulator 100 holds a test head 112 from its sides via fork arms 114. The manipulator 100 raises and lowers the test head 112 on a linear stage 118, and rotates the test head about a twist axis upon a twist gear 120. A fork arm manipulator like the one shown in FIG. 1 is disclosed in U.S. Pat. No. 5,949,002, entitled, "Manipulator for Automatic Test Equipment with Active Compliance," which is assigned to Teradyne, Inc., of Boston, Mass., and is hereby incorporated by reference.

FIG. 2 shows another type of manipulator used for positioning a test head. Rather than using fork arms, the manipulator 200 of FIG. 2 supports a test head 210 internally. The test head 210 is mounted to a central stiffener 212, which is, in turn, mechanically coupled to the manipulator via a central blade (not shown), which extends approximately through the center of the test head. The manipulator 200 can raise and lower the test head 210 on linear bearings 224, and can rotate the test head in the twist direction via twist bearing 214. It can also swing the test head 210 via a swing bearing 222. A manipulator like the one shown in FIG. 2 is disclosed in U.S. patent application Ser. No. 09/615292, entitled "AUTOMATIC TEST MANIPULATOR WITH SUPPORT INTERNAL TO TEST HEAD." This application is also assigned to Teradyne, Inc. and is hereby incorporated by reference.

Both types of manipulators generally include actuators such as motors (not shown) on their respective bearings and linear stages. The actuators move the test head to the peripheral, and orient the test head for docking. The test head is then docked with the peripheral by finely adjusting the position and orientation of the test head.

Manipulators commonly provide a range of "compliance" that allows a test head to be rotated about one or more axes as the test head and peripheral are being docked. The range is "compliant" because the test head literally complies with forces applied to the test head, which during docking tend to cause the mating surface of the test head to become coplanar with the mating surface of the peripheral.

In the fork arm manipulator of FIG. 1, the test head 112 can be made to nod compliantly in a "tumble" direction (NU and ND) by rotating the test head about pins 116. One pin 116 is provided within each fork arm on each side of the test head 112. The test head can also be made to turn compliantly in a "theta" direction ($\Theta L$ and $\Theta R$), via the movement of mechanisms within each fork arm, which allow the pins 116 to move slightly back and forth along the length of each fork arm. Opposing movements of the pins 116 on opposite fork arms effects compliant theta rotation.

The test head 210 of FIG. 2 can compliantly rotate in theta, tumble, and twist via a spherical bearing (not shown) positioned approximately at the test head's center of mass. The spherical bearing has an inner race coupled to the central stiffener 212 and an outer race coupled, via the central blade, to the twist bearing 214.

Semiconductor manufacturers and semiconductor testing facilities place a high premium on minimizing the floor space that their ATE systems occupy. As semiconductor devices become more complex, however, the ATE systems used to test them tend to become larger, requiring more floor space. We have recognized that relatively small test heads (e.g., less than 200 kg) can be held effectively with fork arms that do not occupy much additional floor space. For larger test heads, however, fork arms are required to grow substantially in size, to the point where they occupy a significant percentage of the ATE's overall footprint.

The internally supporting manipulator, like the one shown in FIG. 2, tends to hold heavier test heads with less floor space than an equivalent fork arm manipulator would require. ATE systems now include test heads weighing over 1300 kg. For these larger test heads, internally supporting manipulators are generally the more space efficient alternative.

We have recognized that the centrally supporting manipulator places many constraints on the design of the test head that it supports. For instance, the test head generally must be provided in two portions 210a and 210b, which independently attach to the central stiffener 212. Electrical cables connecting the two portions must be passed either through the central stiffener or around it. Because the central stiffener and associated hardware occupy the center of the test head 210, this area is not available for other purposes, such as cooling and additional electronics.

What would be desirable is a manipulator that is more space efficient for heavy test heads than the fork-arm manipulator but does not impose the design constraints associated with the centrally supporting manipulator.

BRIEF SUMMARY OF THE INVENTION

In accordance with the present invention, a manipulator for supporting a test head includes a body and an interface for supporting the test head from one of its faces, for example, from the rear. The interface includes a first portion fixedly attached to the body and a second portion fixedly attached to the test head at one of its faces. The first and second portions of the interface are rotatably coupled together to allow rotation of the test head about its approximate center of mass. Because the test head is rotatable about its center of mass, it can be made to rotate in response to relatively small applied forces, to satisfy the requirements of compliant docking.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Figure 1:
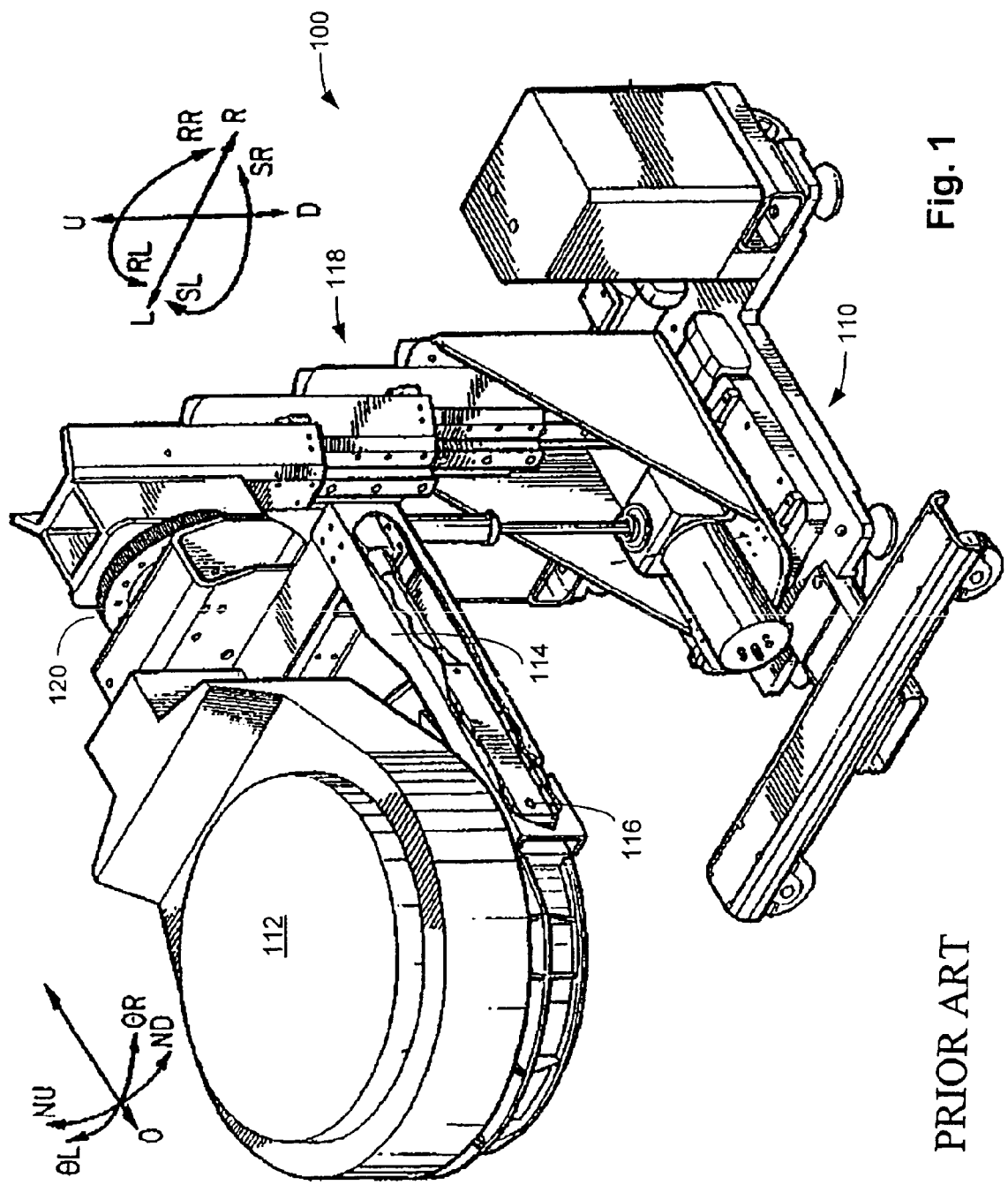
FIG. 1 is a perspective view of a fork arm manipulator according to the prior art.
Figure 2:
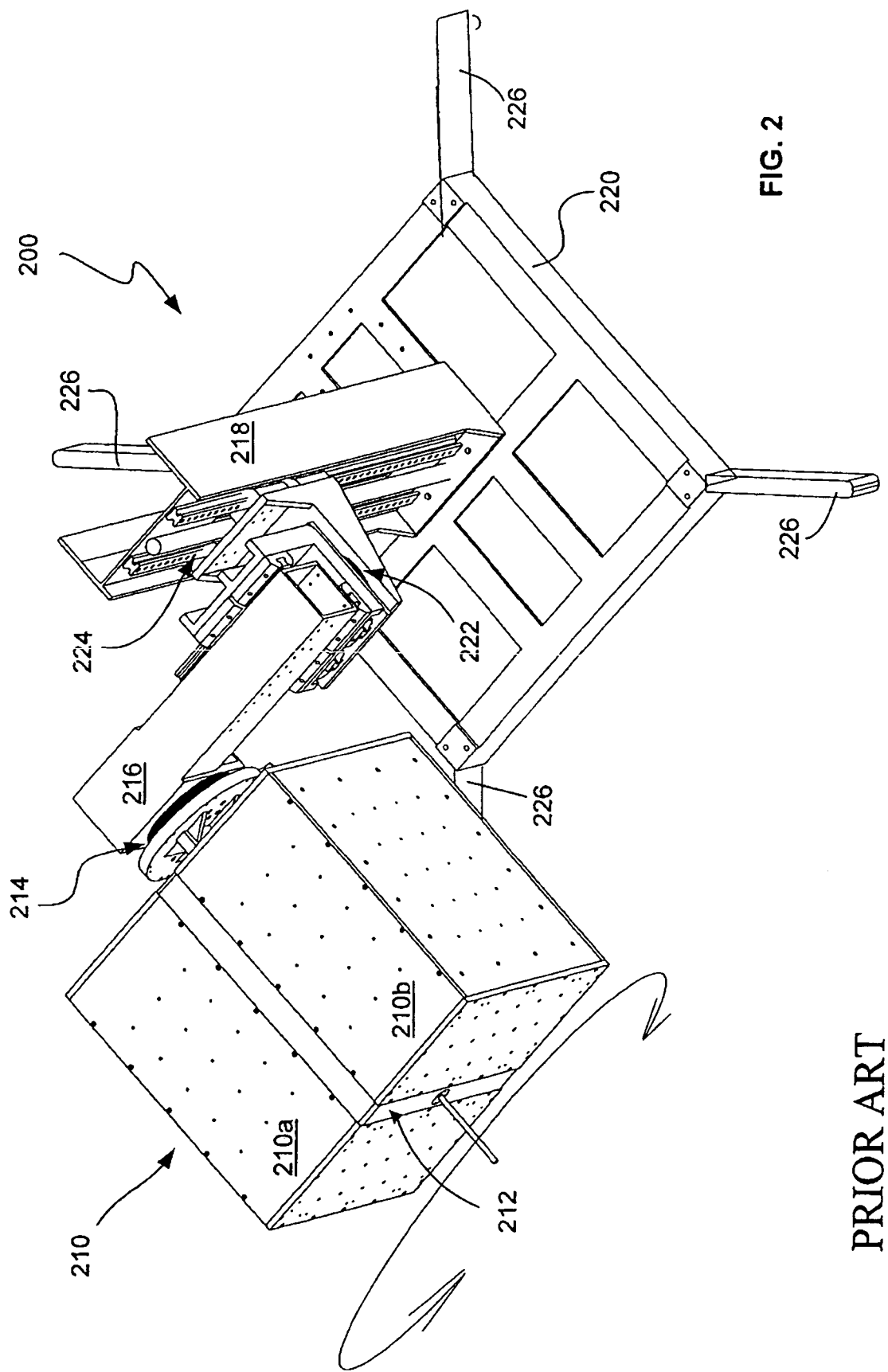
FIG. 2 is a perspective view of a manipulator for internally supporting a test head according to the prior art.
Figure 3A:
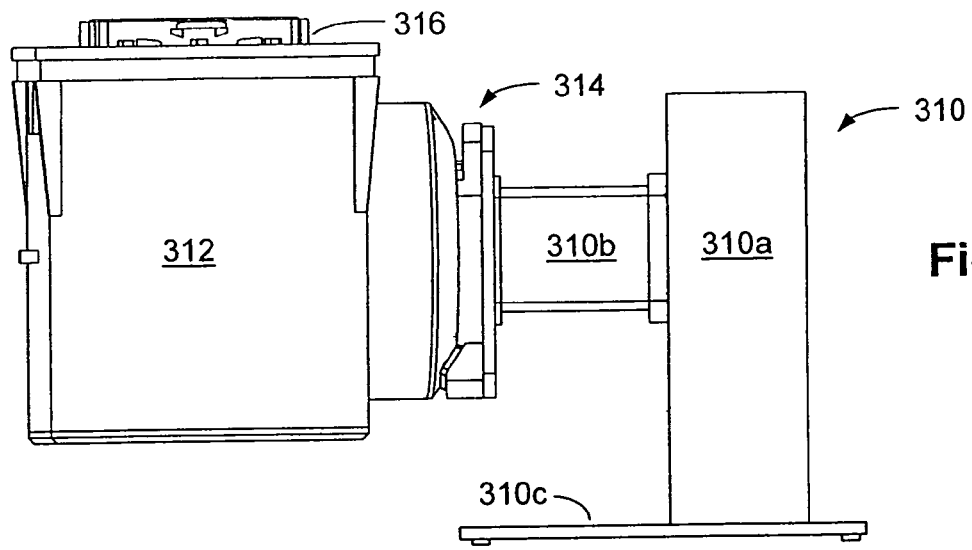
FIGS. 3A–3C are a series of front, elevation views of a manipulator according to a first embodiment of the invention, which shows the test head rotated to different orientations.
Figure 3B:
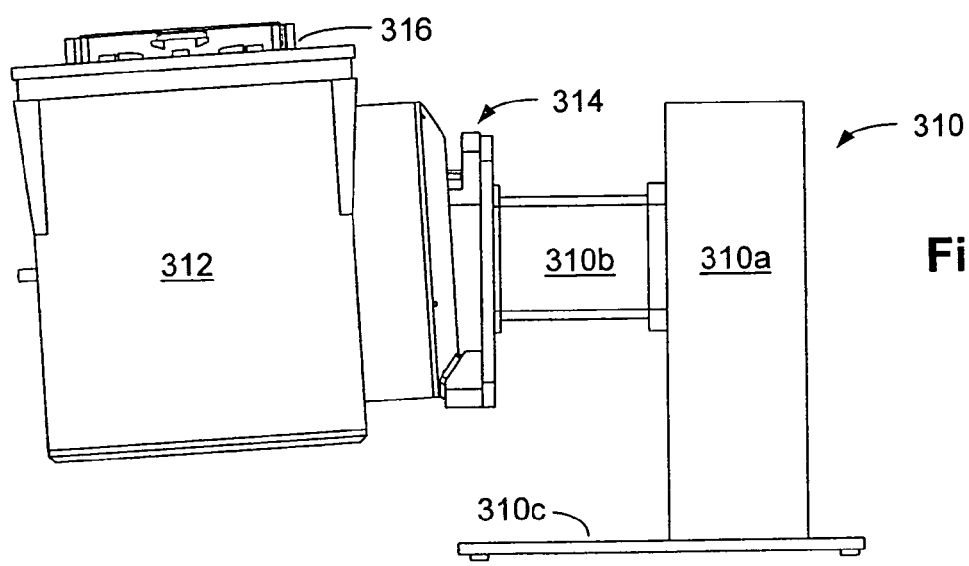
Figure 3C:
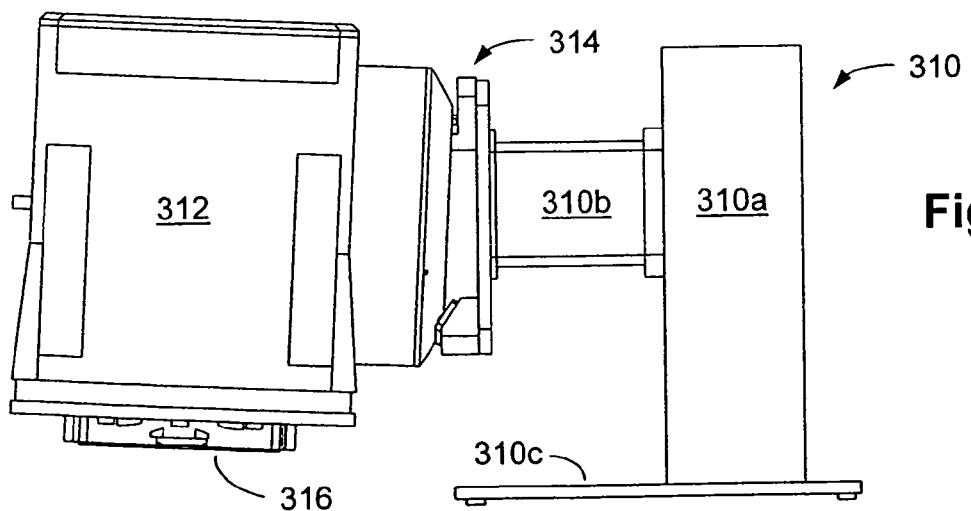

FIGS. 3A–3C show different views of a manipulator 310 for positioning a test head 312 according to a first embodiment of the invention. A device interface board (DIB) 316 is attached to the test head 312 for interfacing the test head with a peripheral (not shown), such as a prober or a handler. The manipulator 310 includes a body 310a mounted to a base 310c. An arm 310b extends from the body 310 for supporting the test head 312. The manipulator 310 can move the arm 310b up and down, in a Z-direction, for positioning the test head vertically in space.

An interface assembly 314 connects the test head 312 to the manipulator 310. The interface assembly includes a first portion attached to the body 310a of the manipulator (via the arm 310b) and a second portion attached to the test head 312. The first and second portions are coupled together in a manner that supports the weight of the test head, yet allows the test head to be rotated about any of the conventional rotational components: theta, tumble, and twist.

FIG. 3A shows the test head 312 rotated to the left in theta, but with tumble and twist nominally at zero degrees. In FIG. 3B, theta and twist are at zero degrees but the test head is rotated downwardly in tumble. In FIG. 3C, theta is at zero degrees, but the test head is rotated upwardly in tumble and downwardly in twist. It should be appreciated that the dimensions and proportions of the equipment shown in FIGS. 3A–3C are presented for illustrative purposes and are not necessarily to scale.

From these views, it is apparent that the first portion of the interface remains in a fixed position with respect to the manipulator and the second portion of the interface remains in a fixed position with respect to the test head. The first and second portions of the interface move with respect to each other, however, to accomplish rotation of the test head.

Although it may not be immediately apparent, the relative movement of the first and second portions of the interface is not mere rotation, such as that accomplished by a hinge. Rather, the second portion of the interface moves in arc-shaped paths with respect to the first portion of the interface. By geometric projection, the arc-shaped paths can be seen to have a common center located within the body of the test head, approximately (and ideally) at its center of mass.

Because the center of the test head's rotation is its center of mass (approximately), the test head rotates about its center of mass, as if it were being held from this point, even though the test head is being supported entirely from the rear. This means that the test head is easily moveable in compliance with normal docking forces. Docking forces need not be sufficient to lift the weight of the test head; they need only be sufficient to overcome friction and small imbalances that arise if the geometric center of rotation does not precisely coincide with the test head's center of mass.

Figure 4:
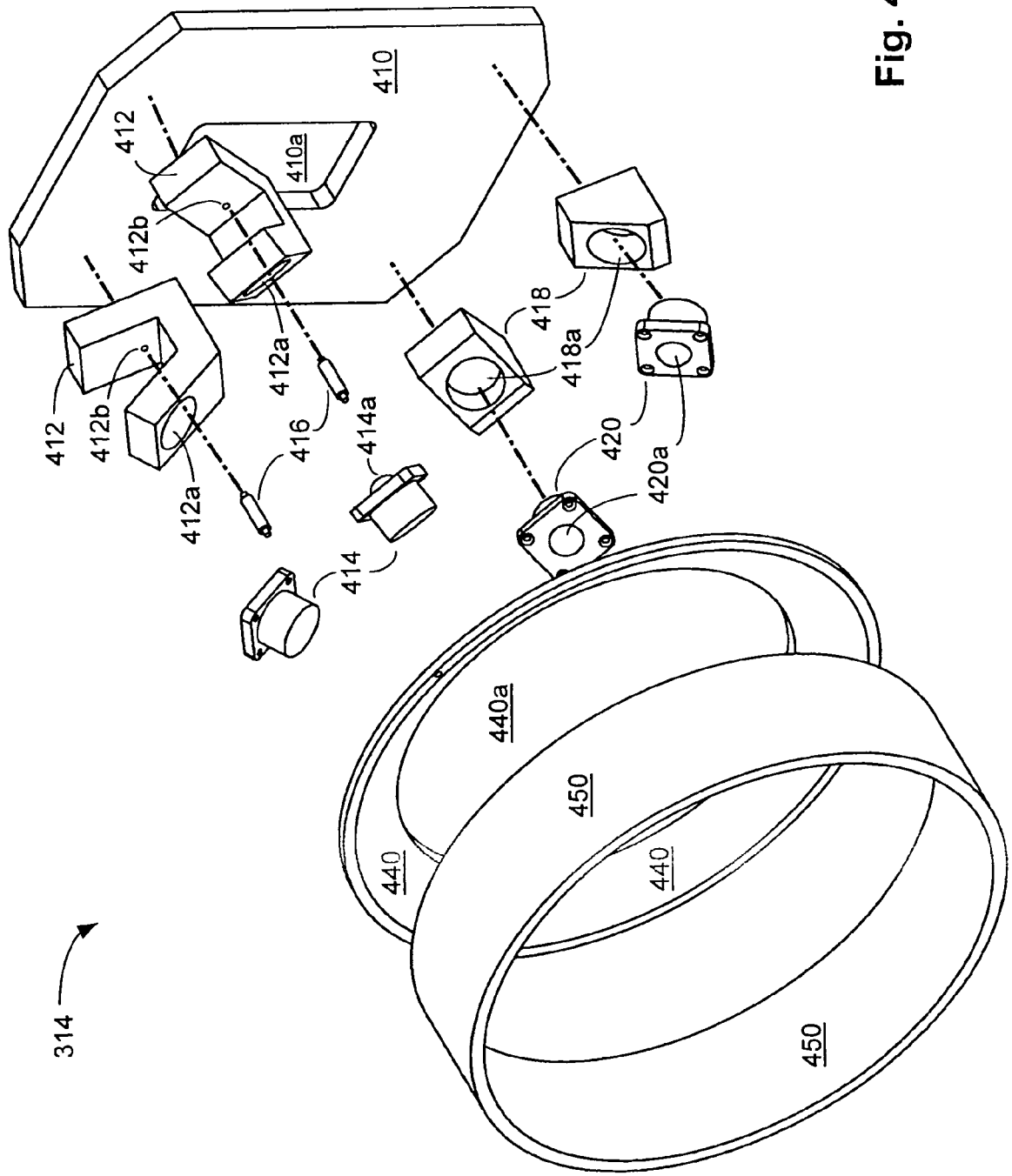
FIG. 4 is an exploded, perspective view of an interface assembly used for rotatably coupling the manipulator to the test head in the arrangement of FIGS. 3A–3C.
Figure 6:
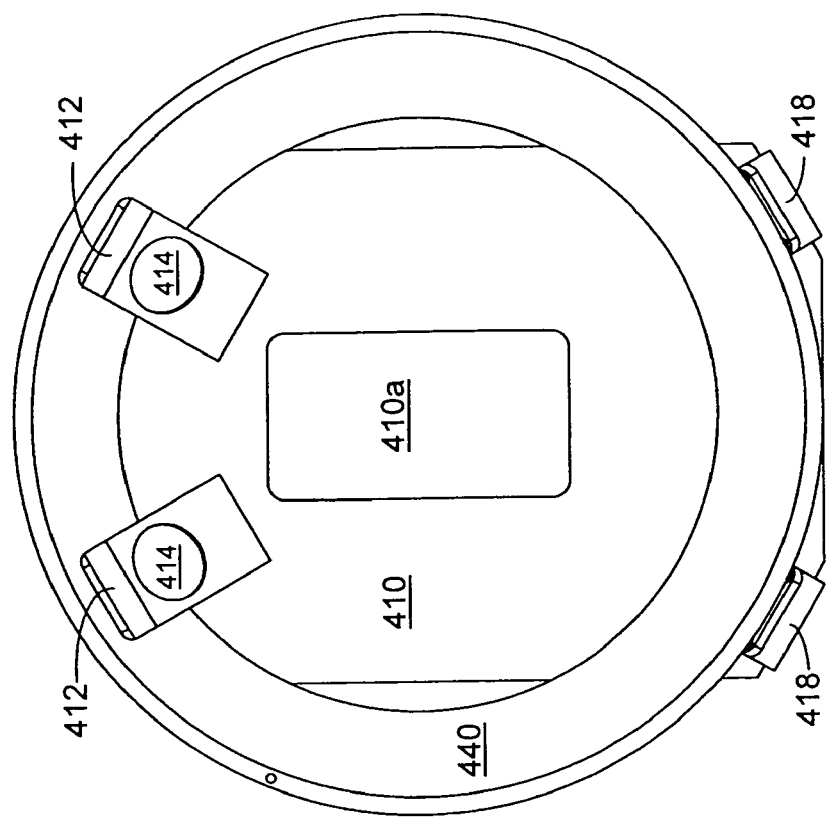
FIG. 6 is an elevated, front view of the interface assembly of FIGS. 4 and 5.
Figure 5:
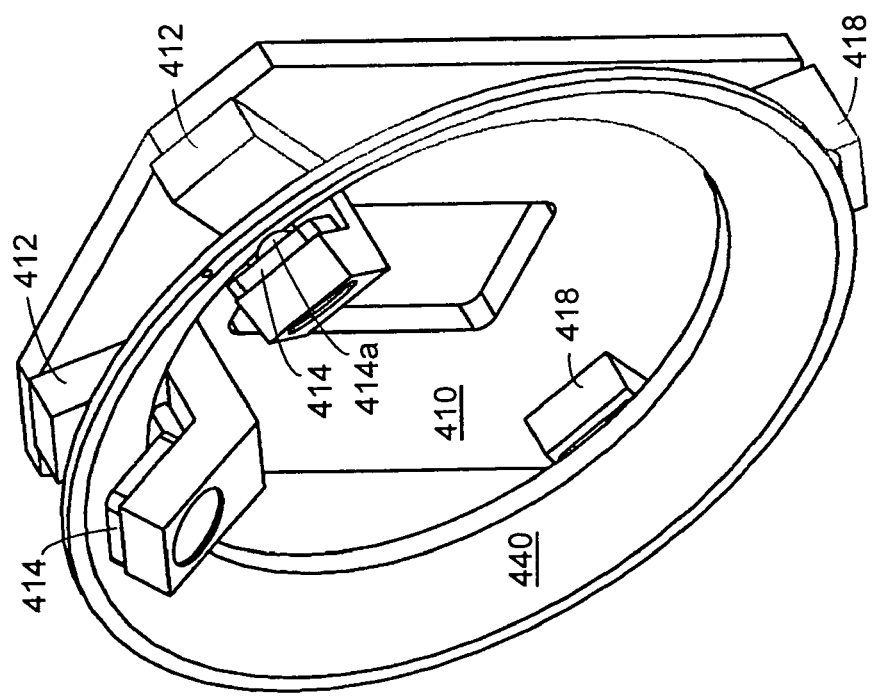
FIG. 5 is an elevated, perspective view of the interface assembly of FIG. 4.

An illustrative embodiment of the interface 314 can be more clearly seen in the exploded view of FIG. 4, and in the perspective side view and front view of FIGS. 5 and 6. The first portion, i.e., the part that normally attaches to the manipulator, includes a support plate 410 and a pair of substantially U-shaped brackets 412. The U-shaped brackets are fixedly attached to an upper region of the support plate 410 by any appropriate means, such as screws, bolts, welding, brazing, and so forth. Low friction contacts 414, such as ball casters (also known as ball transfers), are held by the U-shaped brackets in a position that enables their contact regions, such as balls 414a, face to the rear, in the direction of the support plate. In particular, the ball casters 414 include a cylindrical back portion that is inserted into a hole 412a in each U-shaped bracket, from the inside of the respective U-shaped bracket. The ball casters are then fastened to the insides of the U-shaped brackets, for example, using bolts, although other types of fastening can be used.

A pair of standoff blocks 418 is fastened to a lower region of the support plate 410. Each standoff block 418 preferably includes a hole 418a for receiving an additional low friction contact, such as a ball caster 420. The ball casters 420 are preferably of the same type as the ball casters 414 used at the upper region of the support plate 410. The standoff blocks 418 and the U-shaped brackets 412 hold their respective low friction contacts at respective angles, which roughly conform to the plane of the surfaces with which they make contact, i.e., those of the dish-shaped section 440.

The dish-shaped section 440 forms part of the second portion of the interface, i.e., the portion that is attached to the test head. The dish-shaped section preferably has a central aperture 440a, an concave inner surface facing the test head, and a convex outer surface facing the first portion of the interface. The inner and outer surfaces are each preferably spherical in shape (i.e., they are each sections of a sphere), and the spherical surfaces are preferably concentric. The dish-shaped section fits into the U-shaped brackets 412 such that its inner surface makes contact with the balls 414a of the ball casters 414 and its outer surface makes contact with the balls 420a of the ball casters 420 (best seen in FIG. 5). The dish-shaped section 440 is preferably attached to the test head via a cylindrical section 450. The dish-shaped section 440 is preferably bolted to the cylindrical section 450, which is preferably bolted in turn to the test head. As is usually the case here, the exact fastening technology is not critical, provided it is sufficient to support the expected loading with adequate safety margin.

The role of the cylindrical section 450 is to provide spacing between the dish-shaped section 440 and the test head to which it attaches. This spacing is needed to prevent the U-shaped brackets 412 and standoff blocks 418 from making contact with the rear of the test head as the first and second portions of the interface are moved over their full allowable range. Rather than providing the dish-shaped section 440 and the cylindrical section 450 as separate pieces, they could instead be provided as a single, continuous piece. Alternatively, the cylindrical section 450 could be replaced with separate standoffs that attach around the outer circumference of the dish-shaped section 440, for maintaining the requisite spacing. If this variation is adopted, care should be taken, however, to prevent users from pinching body parts between the dish-shaped section and low friction contacts.

To limit the range of upward tumble rotation, the U-shaped brackets 412 preferably include bumper pins 416. The bumper pins 416 preferably each have a central spring-loaded pin that engages holes 412b in each U-shaped bracket, for holding them near the inside bottom of the respective U-shaped stiffener. They also each have an outer rubber tube surrounding the spring-loaded pin. The rubber tubes prevent damage to the dish-shaped section 440 by providing cushioned contact between the dish-shaped section 440 and the U-shaped brackets 412 when the test head is rotated to its maximum tumble angle. Other cushioned stops (not shown) are preferably also used, to provide cushioned contact at minimum tumble angle, as well as at maximum and minimum theta angles. These other cushioned stops can be implemented in a variety of ways, or instance, by attaching cushioned right angle brackets at appropriate positions and orientations on the support plate 410.

As indicated in the figures, the dish-shaped section 440 is held in place at four contact points (i.e., two instances at 414a and two instances at 418a). To prevent the dish-shaped section 440 from riding on only three of these contact points, the ball casters 414 and 420 are preferably spring-loaded. All four ball casters thus share the load induced by the test head approximately equally, in spite of minor tolerance errors.

Because the inner and outer surfaces of the dish-shaped section 440 are preferably spherical and concentric, and because the centers of these spherical surfaces approximately intersect the test head's center of mass, the forces between the dish-shaped section and each of the low friction contacts are almost entirely normal. This means that, with the test head in place, there is substantially no rotational moment between the first and second portions of the interface. The interface therefore remains stable and does not tend to fall or tilt under the weight of the test head. The forces needed to rotate the test head are only those needed to overcome friction and loading imbalances.

It is apparent from the foregoing that the interface 314 allows the test head to be compliantly rotated about its center of mass in tumble (up and down). Since the dish-shaped section 440 is spherical, it should also be apparent that the test head can be compliantly rotated about its center of mass in theta (left and right). In addition, since the dish-shaped section 440 forms a complete ring, it should further be apparent that the test head can be rotated about its center of mass in twist (clockwise and counterclockwise).

This design has other advantages. Because it is open in the center, electrical cables emanating from the test head can be passed through the center of the interface back to the manipulator, through a hole 410a in the support plate 410. This keeps the cables out of sight and causes their weight to induce a minimum load imbalance. The central region is large enough to allow other components, such as air ducts, blowers, or other cooling equipment, to be positioned therein for cooling the electronics within the test head in a highly space-efficient manner.

The interface 314 and all of its parts are preferably steel, although other metals or materials can be used that meet the loading requirements with adequate safety margin. The dish-shaped section 440 is preferably hardened steel. Hardened steel is preferred because it minimizes distortion in the shape of the dish-shaped section 440, particularly under the load of heavy test heads. In the preferred embodiment, the dish-shaped section is approximately 0.6 m in diameter and approximately 1.5 cm thick. In general, the smaller the diameter of the dish-shaped section 440, the greater the thrust forces between it and the low-friction contacts. Therefore, decreasing the diameter of the dish-shaped section 440 generally requires increasing its thickness and increasing the thrust ratings of the low-friction contacts.

The interface 314, and a manipulator constructed therewith, is suitable for supporting both exceedingly heavy and relatively light test heads. For supporting heavy test heads, it avoids the need for large fork arms, which require considerable space. It also avoids the need for internally supporting the test head, which places many constraints on the test head's design.

Alternatives

Having described one embodiment, numerous alternative embodiments or variations can be made. For example, in the above-described embodiment, the dish-shaped section 440 has been shown and described as part of the second portion of the interface 314 (i.e., attached to the test head), and the low friction contacts have been shown and described as part of the first portion of the interface 314 (i.e., attached to the manipulator). This could be reversed, however, by attaching the dish-shaped section 440 to the manipulator and the low friction contacts to the test head.

As shown and described, the U-shaped brackets 412 reach to the inner surface of the disk-shaped section 440 through its central aperture 440a. Alternatively, the U-shaped brackets could be made to reach around the outside of the disk-shaped section 440. The cylindrical section 450 could then be reduced in size and made to attach near the inner diameter of the dish-shaped section. This variation would allow the aperture 440a to be "removed" from the disk-shaped section 440, leaving it more in the shape of a "cap" than a "ring."

As shown and described herein, the disk-shaped section 440 forms a complete ring, which allows the test head to be rotated in twist over an arbitrarily large angle. Alternatively, the disk-shaped section 440 could be constructed as a partial ring, such as a horseshoe, for providing a smaller range of twist rotation. As yet another variation, the disk-shaped section 440 could be provided as a pair of opposing sections, for instance, left and right or top and bottom sections, with the other portions of the ring removed. The size of the sections could be made large enough to allow small twist rotations, such as those needed for compliant docking, but would not necessarily be large enough to allow gross adjustments of the test head's twist angle.

Depending on the desired performance, the inner and outer surfaces of the disk-shaped section 440 need not be perfectly spherical. For example, slightly opening the curvature of the outer surface, closing the curvature of the inner surface, or both, induces a rotational moment that tends to restore the test head to a centered position, once it has been moved from its centered position.

The low friction contacts 414 and 420 have been particularly described herein as thrust ball caster assemblies; however, other types of contacts can be used, such as other types of rolling contacts or frictional contacts. An example of a "frictional" low-friction contact is Teflon pads. Teflon or other low friction plastics or materials may be used instead of roller bearing assemblies, particularly in lightweight, low cost test systems. "Frictional" low friction contacts may be better used against some surfaces than others. Therefore, if this variation is adopted, it may be advantageous to cover the dish-shaped section 440 with a surfacing material having a particularly low coefficient of friction when used in connection with the "frictional" low friction contacts. For some test heads, it may be advantageous to use air bearings in place of conventional roller bearings to reduce friction to negligible levels. Suitable air bearings are available commercially from Space Electronics, Inc., of Berlin, Conn.

As describe above, four bearing assemblies support the test head via the dish-shaped section 440. The number of bearing assemblies could clearly be varied within the scope of the invention. In addition, the contacts need not be identical. For instance, a pair of thrust bearings could be used at the top and bottom of the support plate 410 for supporting the weight of the test head, and a pair of "frictional" contacts could be used at the left and right of the support plate for maintaining its position and guiding its theta rotation.

The interface 314 need not be provided as a separate unit, to be later integrated with a manipulator and a test head. Instead, one portion could be built into the manipulator and another portion could be built into the test head. The parts of the interface could then be mated together when the test head is integrated with the manipulator.

Figure 7:
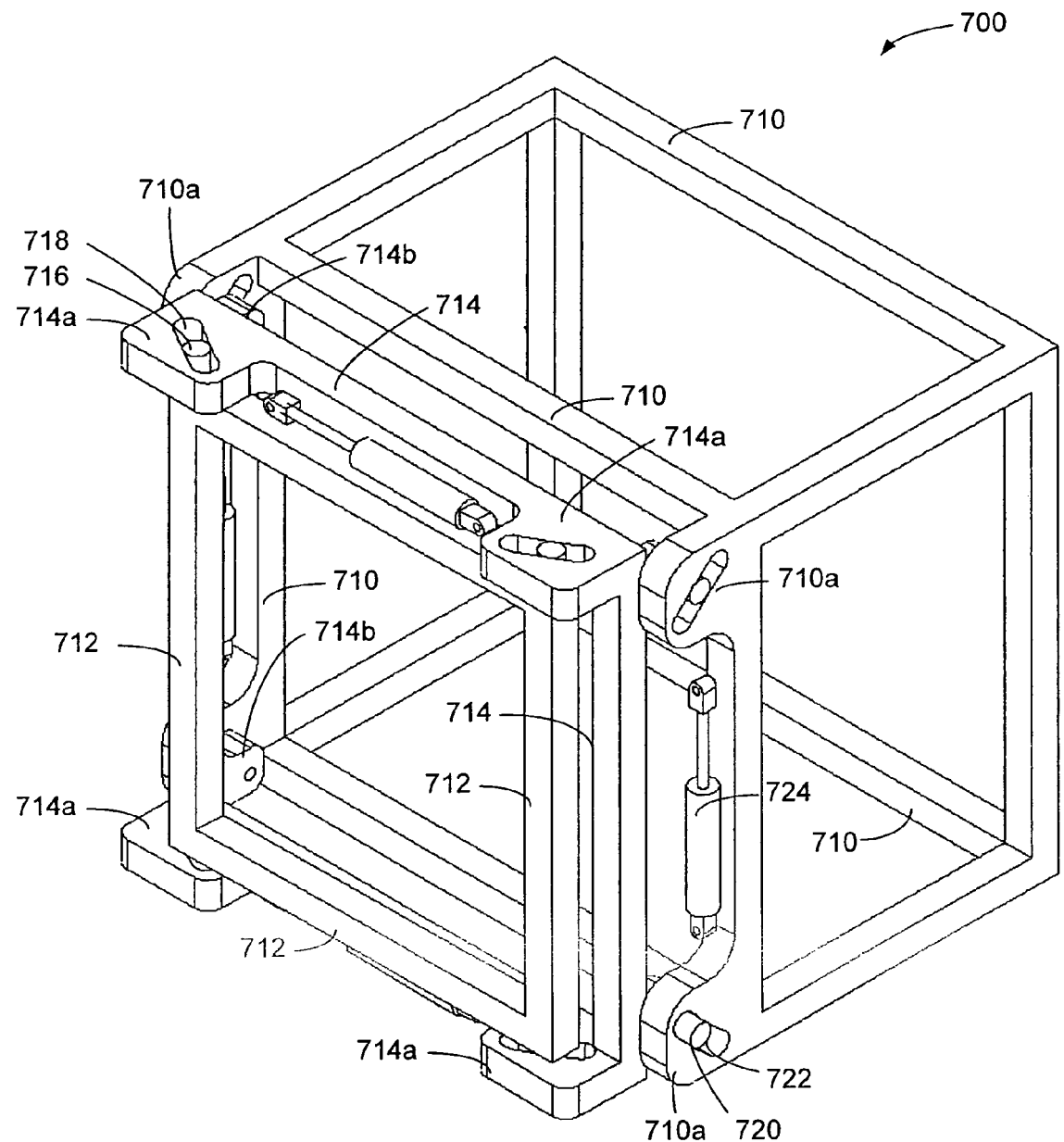
FIG. 7 is an elevated, perspective view of a portion of an interface assembly and test head according to a second embodiment of the invention.
Figure 8A:
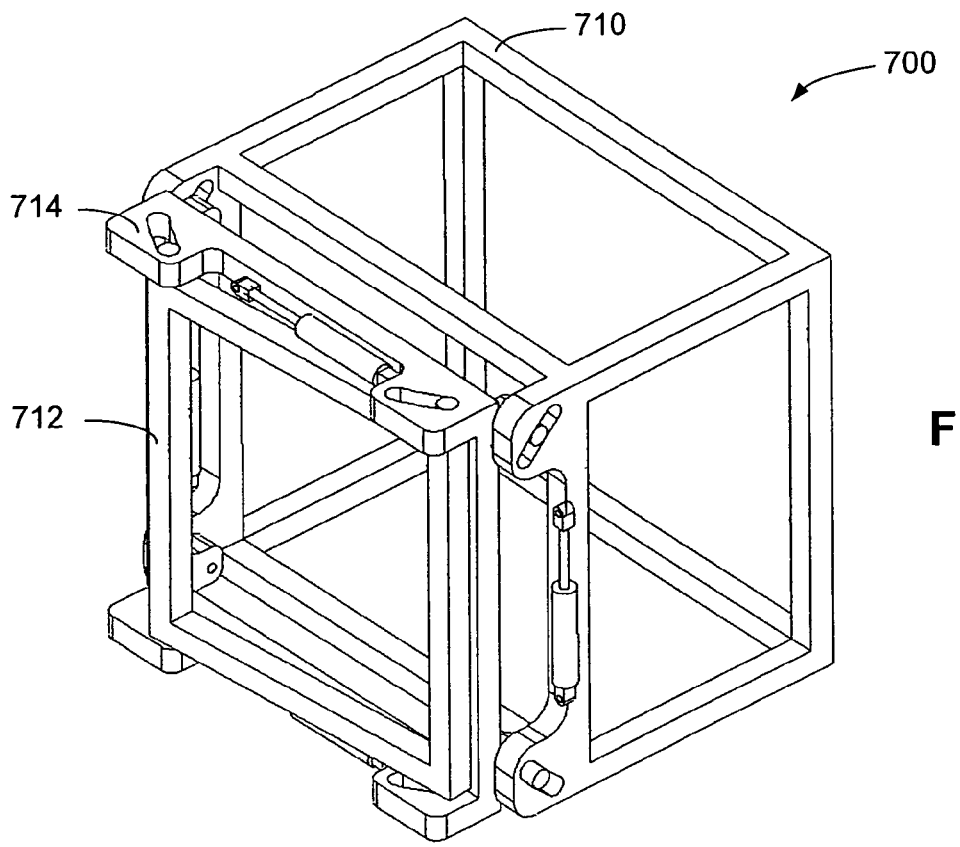
FIGS. 8A and 8B are elevated, perspective views of the embodiment of FIG. 7, which show the test head rotated to different orientations.
Figure 8B:
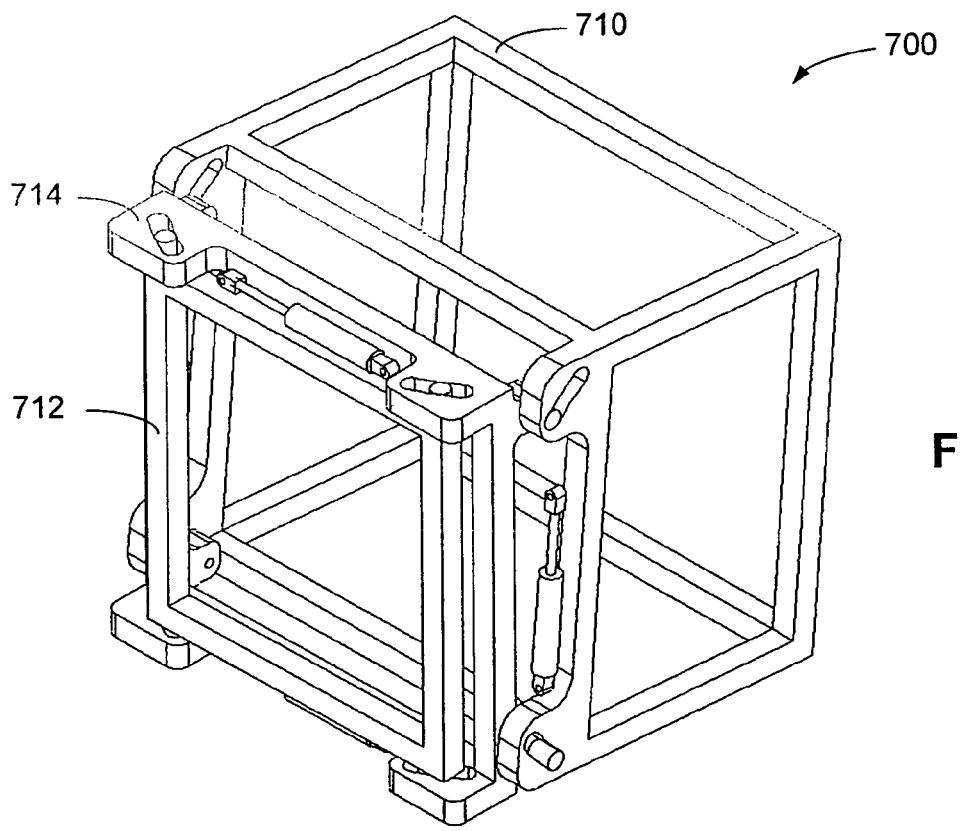

The interface 314 can be varied in a more basic manner within the scope of the invention. For example, as shown in FIGS. 7–9, a second embodiment of an interface for supporting a test head provides compliant rotation by breaking down the test head's rotations into separate components of theta and tumble. This interface preferably provides four channels 718 for allowing rotation in theta and four channels 722 for allowing rotation in tumble. Cam followers preferably ride within the arc-shaped channels to allow relative rotation of different parts of the interface. For each component of rotation, the respective channels share a common axis of rotation (i.e., they are aligned concentrically), which approximately (and ideally) intersects the test head's center of mass. Because the axis of rotation for each component intersects the center of mass, the test head has no rotational moment, and thus tends not to fall or tilt, even though it is held entirely from the rear.

A manipulator supports the interface by attaching to a first frame section 712. Cam followers 716 preferably project upwardly and downwardly from corners of the first frame section 712, for engaging channels 718, which are preferably formed within a second frame section 714. Movement of the first frame section 712 with respect to the second frame section 714 thus effects theta rotation of the test head (See FIG. 8A).

To effect tumble rotation, tabs 714b are fixedly attached to and extend from the rear of second frame section 714 (from the viewpoint of FIG. 7). Cam followers 720 extend from these tabs 714b for engaging channels 722, which are preferably formed within tabs 710a of the test head frame 710. Movement of the second frame section 714 with respect to the test head thus accomplishes the desired tumble rotation of the test head (See FIG. 8B).

This second embodiment of the interface is analogous to the first embodiment. The first and second frame sections 712 and 714 and their associated hardware constitute a first portion of the interface (i.e., one to be attached to the manipulator), and the tabs 710a extending from the test head constitute the second portion of the interface. The first and second portions move relative to each other to allow compliant rotation of the test head approximately about its center of mass. Unlike the first embodiment, however, this embodiment does not support compliant rotation in twist. If needed, compliant twist rotation can be accomplished though the use of separate equipment.

Where twist rotation is externally provided, it is preferable to prevent the tabs that extend from the second frame section 714b from rubbing against the tab sections 710a. This can be accomplished by placing low-frictional pads, ball casters, of similar components, between the tabs 714b and 710a.

To limit the speed at which the test head can be rotated, the interface of this embodiment preferably includes rate limiters, such as gas springs 724. A first pair of gas springs is preferably coupled between the first and second frame sections 712 and 714, and a second pair of gas springs is preferably coupled between the second frame section 714 and the test head.

The second embodiment of the interface can be varied in numerous ways, many of which are similar to those described in connection with the first embodiment, and will not be repeated here. Other variations include replacing the channels 718 and 722 with tracks, for example, curved linear bearings. In addition, the relative positions of the channels and cam followers can be exchanged. For instance, channels can be formed within the first frame section 712 (or a tab extending therefrom) for engaging cams extending from the second frame section 714.

The channels can be made arbitrarily long or short, depending upon how much rotation is desired, whether gross or merely fine, compliant adjustment is required, and other design considerations.

The shape of the channels (or tracks) can depart from perfectly circular arcs. By opening the curvature of the channels, the test head will be subjected to a restoring force that tends to drive it toward a centered position.

Although it provides compliant rotation in both theta and tumble, the interface of FIGS. 7 and 8 could be simplified to provide rotation in one direction only, i.e., either theta or tumble. For example, by removing the first frame section 712 and attaching the second frame section 714 directly to the manipulator, the interface can be made to provide tumble rotation only. Similarly, by attaching the second frame section 714 directly to the test head, the interface can be made to provide theta rotation only.

As used herein, the "rear" of the test head conventionally refers to the face of the test head that attaches to the manipulator. This designation is clearly arbitrary, as the test head could attach to the manipulator at a number of its different faces. Also, the interface 314 and the corresponding interface of the second embodiment each have a second portion attached to the rear of the test head. However, the particular means of attaching to the rear of the test head need not be accomplished via connections at the rear surface of the test head. For instance, the second portion of the interface could be connected to the rear of the test head via brackets or other hardware extending from its sides, top, bottom, or inside. Moreover, the second portion of the interface can be "attached" to the test head by being formed coextensively with the test head, rather than being a separate part. This variation is used in the second embodiment, wherein the tabs 710a are actually formed within the frame 710 of the test head.

While the invention has been particularly shown and described with reference to the preferred embodiments thereof, it will be understood by those skilled in the art that various changes in form and detail may be made therein without departing from the spirit and scope of the invention.

What is claimed is:

1. A manipulator for a test system, comprising:
   a body; and
   an interface for supporting a test head, including a first portion coupled to the body and a second portion fixedly attached to a rear surface of the test head, one of the first and second portions of the interface comprises a section and the other of the first and second portions comprises low-friction contacts attached thereto; the low friction contacts each having direct low-friction contact with the section and coupled to the section for allowing rotation of the first portion of the interface with respect to the second portion of the interface,
   wherein the first and second portions of the interface are rotatably coupled together to allow rotation of the test head about its approximate center of mass in at least one of a theta and tumble direction.

2. The manipulator of claim 1 wherein the low-friction contacts comprises thrust bearing assemblies.

3. The manipulator of claim 1 wherein the section has an inner surface and an outer surface, and
   wherein at least one low-friction contact is coupled to the inner surface of the section and at least one low-friction contact is coupled to the outer surface of the section.

4. The manipulator of claim 3 wherein the inner surface is concave substantially facing the test head and the outer surface is convex.

5. The manipulator of claim 3 wherein the inner surface comprises a first region and the outer surface comprises a second region lower than the first region, and
   wherein at least one low-friction contact is coupled to the first region and at least one low-friction contact is coupled to the second region.

6. The manipulator of claim 3 wherein the low-friction contacts are constrained to move along arc-shaped paths.

7. A manipulator for a test system, comprising:
   a body; and
   an interface for supporting a test head, including a first portion coupled to the body and a second portion fixedly attached to a rear surface of the test head, one of the first and second portions of the interface comprises a section and the other of the first and second portions comprises low-friction contacts attached thereto; the low friction contacts each having direct low-friction contact with the section and coupled to the section for allowing rotation of the first portion of the interface with respect to the second portion of the interface,
   wherein the first and second portions of the interface are rotatably coupled together to allow rotation of the test head about its approximate center of mass in at least one of a theta and tumble direction and wherein the section has an inner surface and an outer surface that are substantially spherical and substantially concentric.

8. The manipulator of claim 7 wherein the low-friction contacts comprises at least one low-friction bearing assembly coupled to an upper region of the inner surface of the section and at least one low-friction assembly coupled to a lower region of the outer surface of the section.

9. The manipulator of claim 7 wherein the assembly includes an aperture for conveying electrical cables between the test head and other portions of the automatic test system.

10. The manipulator of claim 7 wherein the interface further comprises:
    a support plate; and
    at least one substantially U-shaped bracket fixedly attached to an upper region of the support plate,
    wherein at least one of the low-friction contacts is fixedly attached to the at least one substantially U-shaped bracket and positioned in contact with the inner surface of the section.

11. The manipulator of claim 7 wherein the low-friction contacts comprises thrust bearing assemblies.

12. The manipulator of claim 7 wherein the low-friction contacts are constrained to move along arc-shaped paths.

13. A manipulator for a test system, comprising:
    a body; and
    an interface for supporting a test head, including a first portion coupled to the body and a second portion fixedly attached to a rear surface of the test head, one of the first and second portions of the interface comprises a section and the other of the first and second portions comprises low-friction contacts attached thereto; the low friction contacts each having direct low-friction contact with the section and coupled to the section for allowing rotation of the first portion of the interface with respect to the second portion of the interface,
    wherein the first and second portions of the interface are rotatably coupled together to allow rotation of the test head about its approximate center of mass in at least one of a theta and tumble direction and wherein the low-friction contacts are constrained to move along arc-shaped paths.

14. The manipulator of claim 13 wherein the low-friction contacts are cam followers and the arc-shaped paths are defined by channels within which the cam followers can move.

15. The manipulator of claim 13 wherein four arc-shaped paths are provided for rotation about a first axis of rotation, the four arc-shaped paths being provided in two pairs, each pair having a common center.

16. The manipulator of claim 15 wherein the first axis is one of a theta and a tumble axis.

17. The manipulator of claim 15 wherein four additional arc-shaped paths are provided for rotation about a second axis of rotation, the four additional arc-shaped paths being provided in two pairs, each pair having a common center.

18. The manipulator of claim 17 wherein the first axis is one of a theta and a tumble axis, and the second axis is the other of the theta and the tumble axis.

19. The manipulator of claim 13 wherein the first portion of the interface includes first and second frame sections,
a first frame section fixedly attached to the body of the manipulator and rotatably attached to the second frame section to allow rotation of the test head about a first axis, and
a second section rotatably attached to the second portion of the interface to allow rotation of the test head about a second axis.

20. The manipulator of claim 13 wherein the low-friction contacts comprises thrust bearing assemblies.

* * * * *